United States Patent
Fenstermaker et al.

(10) Patent No.: US 6,882,555 B2
(45) Date of Patent: Apr. 19, 2005

(54) BI-DIRECTIONAL BUFFERING FOR MEMORY DATA LINES

(75) Inventors: Larry R. Fenstermaker, Nazareth, PA (US); Zheng Chen, Macungie, PA (US); Gregory S. Cartney, Coplay, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 37 days.

(21) Appl. No.: 10/464,083

(22) Filed: Jun. 18, 2003

(65) Prior Publication Data

US 2004/0257860 A1 Dec. 23, 2004

(51) Int. Cl.[7] .................................................. G11C 5/06
(52) U.S. Cl. ...................................... 365/63; 365/233.5
(58) Field of Search ............................... 365/63, 233.5, 365/189.05, 189.08

(56) References Cited

U.S. PATENT DOCUMENTS

| | | | | |
|---|---|---|---|---|
| 5,870,410 A | * | 2/1999 | Norman et al. | 714/725 |
| 6,038,627 A | * | 3/2000 | Plants | 710/100 |
| 6,292,021 B1 | * | 9/2001 | Furtek et al. | 326/41 |
| 6,664,807 B1 | * | 12/2003 | Crotty et al. | 326/40 |

* cited by examiner

*Primary Examiner*—Anh Phung
(74) *Attorney, Agent, or Firm*—MacPherson Kwok Chen & Heid LLP; Greg J. Michelson

(57) ABSTRACT

Systems and methods are disclosed for implementing configuration memory on a programmable logic device. For example, in accordance with one embodiment of the present invention, bi-directional buffers are implemented between sections of a column of memory. The buffers may provide buffering for data lines extending through the column of memory.

21 Claims, 3 Drawing Sheets

BI-DIRECTIONAL BUFFERING FOR MEMORY DATA LINES

TECHNICAL FIELD

The present invention relates generally to electrical circuits and, more particularly, to configuration memory within a programmable logic device.

BACKGROUND

A programmable logic device is generally configured by storing configuration data in its configuration memory. The configuration memory then provides signals based on the configuration data to control circuit elements (e.g., multiplexers) that determine the function and operation of the programmable logic device (e.g., a field programmable gate array, a complex programmable logic device, or a programmable interconnect device).

For example, FIG. 1 illustrates a conventional six-transistor memory cell (also referred to as a static random access memory (SRAM) cell), which is used to store one bit of configuration data. These types of memory cells are distributed throughout the programmable logic device to form columns of configuration memory, which are connected by complementary pairs of data lines (also referred to as bit lines and labeled DATA and DATAN in FIG. 1). The data lines in each column provide a data path to allow data to be written to (also known as configuring or programming) and read from the memory cells in that column. For a large programmable logic device, the data lines may be thousands of microns long and connect thousands of the memory cells.

In terms of general operation for the memory cell of FIG. 1, data (e.g., one configuration bit) may be transferred to and from the memory cell by switching on two of its six transistors (labeled access devices) with an address line. During a read operation, the data lines (DATA, DATAN) are generally pre-charged to a high voltage state before the access devices for the memory cell are switched on. When the access devices are switched on, the memory cell pulls the DATA line or the DATAN line low, which indicates that a zero or a one, respectively, is stored in the memory cell.

During a write operation, one of the data lines is driven high while the other data line is driven low, depending upon whether a zero or a one is to be stored in the memory cell. The access devices are then switched on by the address line and the state of the memory cell is set based upon the voltage levels of the data lines. During a read or a write operation of the memory cell, the access devices to the other memory cells in the column are switched off to avoid unintended reading or writing to those memory cells.

A drawback of conventional columns of configuration memory is that high parasitic resistance and capacitance from the data lines, along with the combined leakage current from all of the un-accessed memory cells that are on the same data lines, may cause a significant voltage drop from source to destination (e.g., from memory cell to read sensing circuit or from data input buffer to memory cell). The voltage drop may decrease the stability of the memory cell being accessed and result in errors or difficulty in reading or writing to large programmable logic devices.

Conventional techniques to address this problem, such as over-designing for the stability of the memory cell, add significant circuit area and/or lower the expected quality and yield, while increasing the complexity of the programmable logic device. As a result, there is a need for improved techniques to read and write data to memory within a programmable logic device.

SUMMARY

Systems and methods are disclosed herein to implement memory on a programmable logic device. For example, in accordance with an embodiment of the present invention, columns of memory within a programmable logic device are implemented in sections with a bi-directional data line buffer between each section. The buffer may use less area, require less critical timing, and employ fewer control signals than some conventional techniques. The memory cells within the columns may be sized accordingly for stability.

The techniques may be applied to a family of device sizes, allowing the length of the columns of memory to increase by adding additional sections of memory and buffers, with minimal adverse affects to the memory cells. As an implementation example, techniques discussed herein may provide bi-directional buffering for segmented configurable memory data lines for a field programmable gate array.

More specifically, in accordance with one embodiment of the present invention, a programmable logic device includes a column of configuration memory divided into a plurality of sections; a pair of data lines disposed within the column of configuration memory; and a buffer disposed between each of the sections and adapted to couple the data lines between the sections adjacent to the buffer.

In accordance with another embodiment of the present invention, a configuration memory within an integrated circuit includes a plurality of partial columns of memory; a pair of data lines routed through the partial columns of memory; and means for coupling the data lines and buffering the data on the data lines between the partial columns of memory.

In accordance with another embodiment of the present invention, a method of providing configuration memory within a programmable logic device includes providing a plurality of columns of memory, with each of the columns divided into segments; providing a corresponding pair of data lines through each of the columns of memory; and coupling the data lines between the segments to provide data buffering for data on the data lines.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

Embodiments of the present invention and their advantages are best understood by referring to the detailed

DETAILED DESCRIPTION

Figure 2:
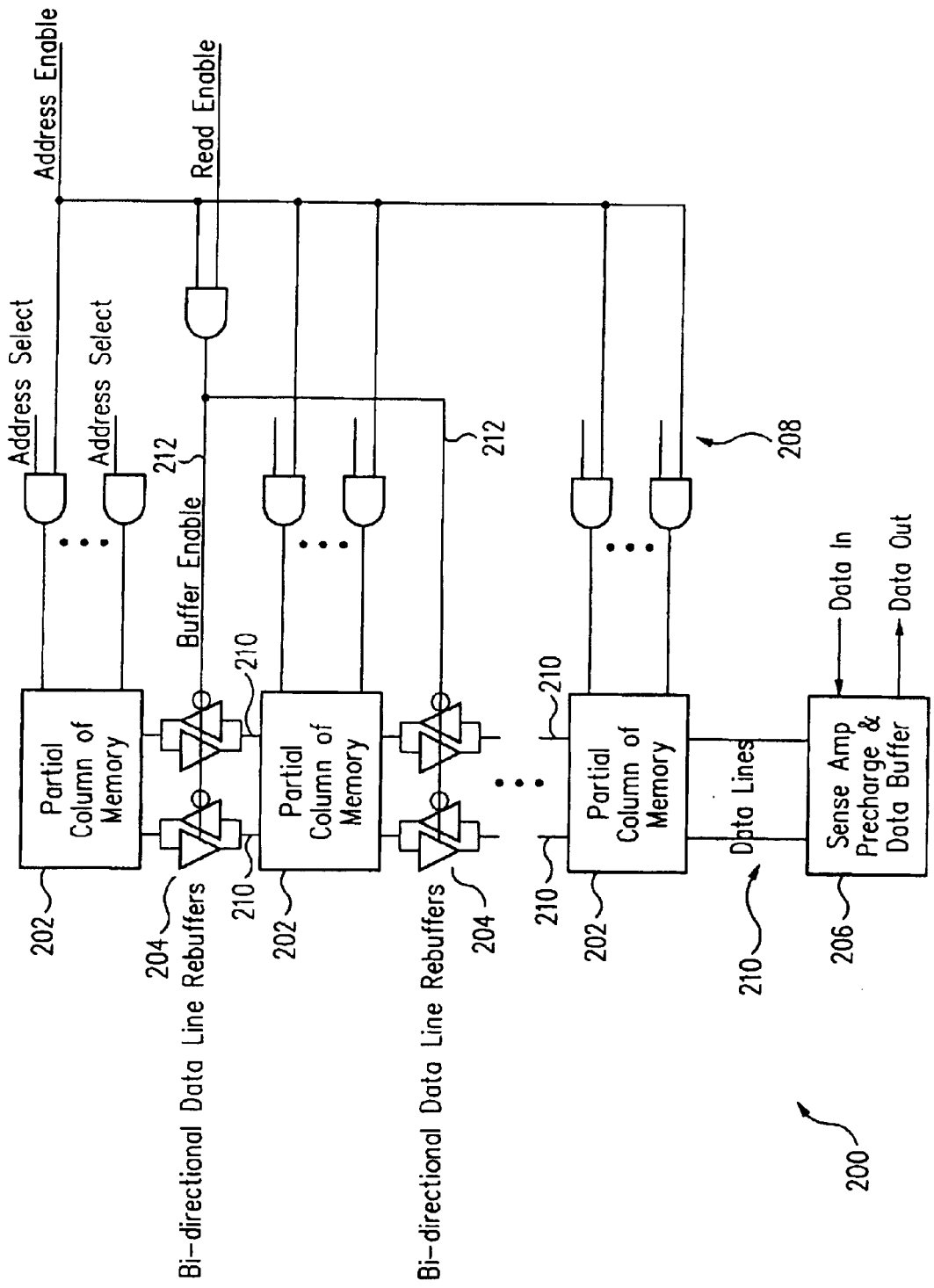
FIG. 2 shows a block diagram illustrating a column of memory in accordance with an embodiment of the present invention.

FIG. 2 shows a block diagram illustrating a column of configuration memory 200 in accordance with an embodiment of the present invention. One or more columns of configuration memory 200 may be implemented in a programmable logic device (or other type of integrated circuit) to store configuration data or other types of data.

Figure 1:
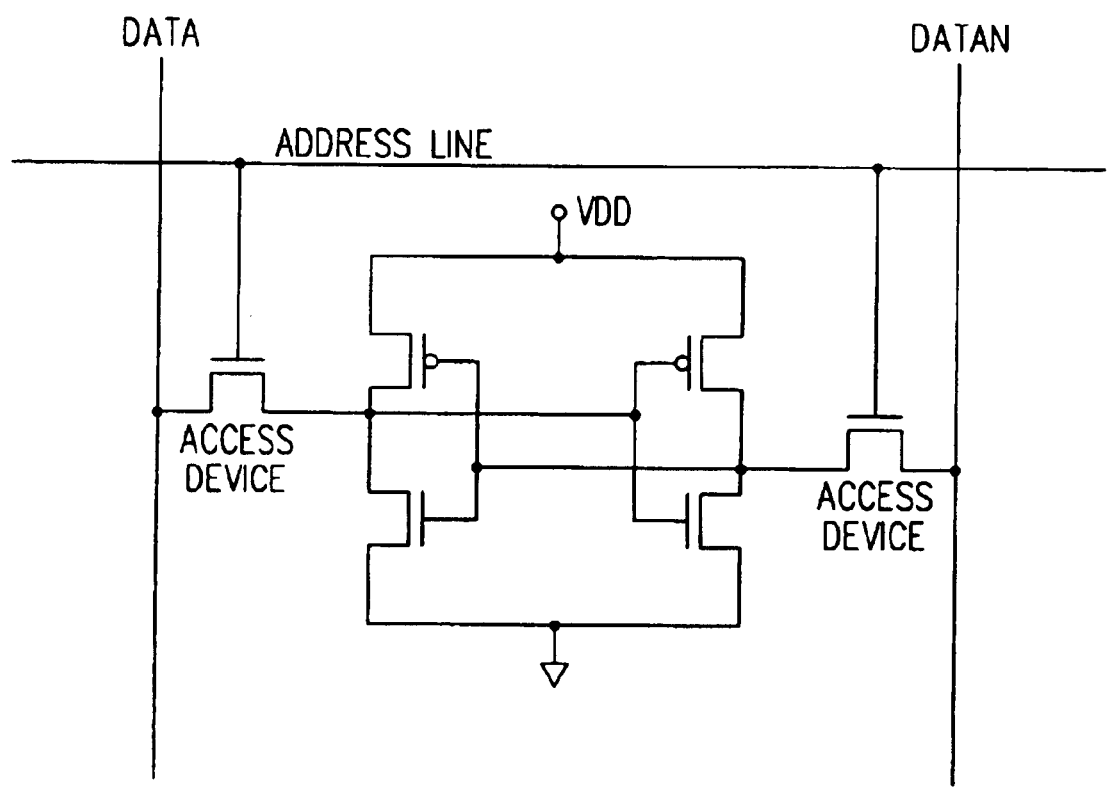
FIG. 1 shows a block diagram illustrating a conventional memory cell.

Configuration memory 200 includes memory sections 202, buffers 204, input/output circuit 206, decode circuits 208, and data lines 210. Each memory section 202 includes a number of memory cells (not shown), which are arranged as one column and a number of rows. The memory cells, for example, may be six-transistor SRAM cells, as described in reference to FIG. 1, or other conventional types of memory cells.

Buffers 204 are bi-directional buffers, with each buffer 204 located between two of memory sections 202, as shown in FIG. 2. Buffers 204 may be viewed as functioning to split data lines 210 into smaller segments so that the voltage drop and leakage current, discussed above, are insignificant or do not unduly affect performance.

A number of memory sections 202 and buffers 204 may be cascaded as shown to form the desired length of column of memory. Buffers 204 are located between memory sections 202 (i.e., one buffer 204 between adjacent memory sections 202) to buffer (re-buffer) data lines 210 between memory sections 202.

Data lines 210 travel the length of configuration memory 200 via memory sections 202 and buffers 204. Buffers 204 function to buffer and couple data lines 210 between adjacent segments of memory sections 202.

Input/output circuit 206 provides conventional sensing and data input/output functions for data lines 210. For example, input/output circuit 206 may provide sense amplifiers, pre-charging, and data input/output buffering to read from and write to memory cells within memory sections 202 via data lines 210.

Decode circuits 208 provide conventional address decoding for each memory section 202 based on address signals (e.g., address select and address enable signals). Buffers 204 may receive a buffer enable signal 212 based on address signals and read or write enable signals. For example, as shown in FIG. 2, buffer enable signal 212 may be based on a read enable signal and an address enable signal. The read enable signal and the address enable signal may be specifically for configuration memory 200 (e.g., for one specific column of memory) or may be global signals for all of the columns of memory on the programmable logic device.

Buffers 204 are bi-directional buffers, with the directionality selected to match the desired write or read operation. For example, buffers 204 are enabled via buffer enable signal 212 to drive away from input/output circuit 206 during a pre-charge and a write operation and drive towards input/output circuit 206 during a read operation.

Figure 3:
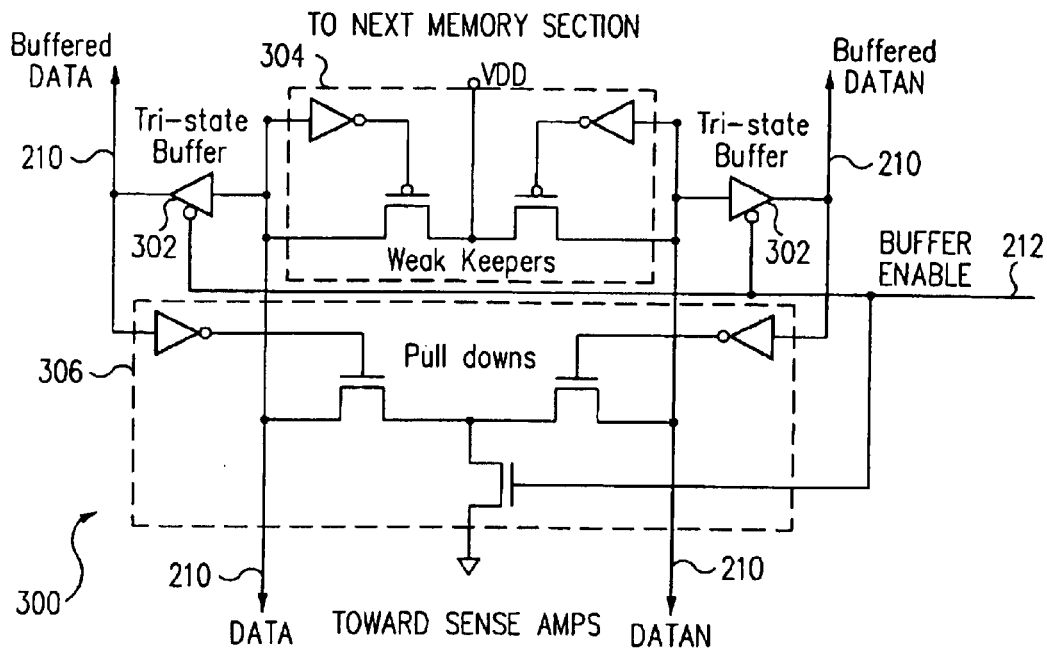
FIG. 3 shows a circuit diagram illustrating an exemplary detailed implementation for a portion of FIG. 2 in accordance with an embodiment of the present invention.

FIG. 3 shows a circuit 300 illustrating an exemplary detailed implementation for one of buffers 204 of FIG. 2 in accordance with an embodiment of the present invention. Circuit 300 includes buffers 302, a keeper circuit 304, and a pull-down circuit 306. Buffers 302 drive corresponding data lines 210 (labeled buffered DATA and buffered DATAN), which are provided to memory section 202 above circuit 300 in configuration memory 200 (FIG. 2). Buffers 302 are tri-stated when not in use and controlled by buffer enable signal 212.

Assuming a pre-charge operation is performed on data lines 210 prior to a read operation, keeper circuit 304 functions as a weak feedback keeper to hold data lines 210 (labeled DATA and DATAN) to a high logical value (e.g., supply voltage VDD) and maintain the charge (i.e., prevent a voltage level on data lines 210 from becoming dynamic). Pull-down circuit 306, controlled by buffer enable signal 212, functions to drive corresponding data lines 210 (labeled DATA and DATAN), which are provided to memory section 202 or input/output circuit 206 below circuit 300 in configuration memory 200 (FIG. 2). Consequently, either of data lines 210 (i.e., DATA or DATAN), which is pulled down by the accessed memory cell in one of the memory sections 202 during a read operation, will switch on any pull-down circuits 306 lower in the column of configuration memory 200 to transfer its low logical value to input/output circuit 206.

Figure 4:
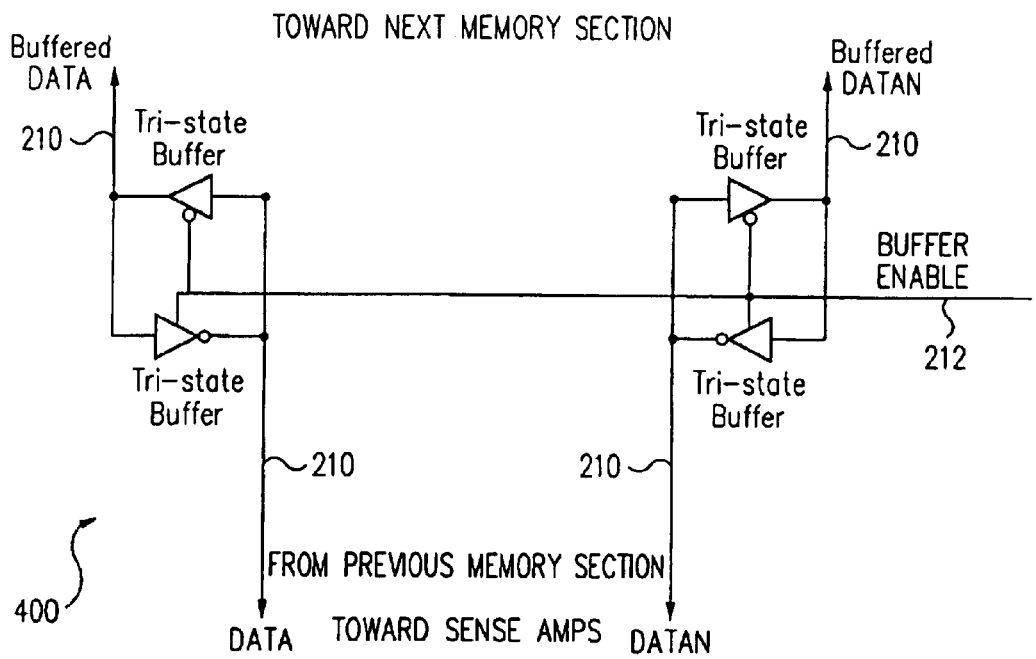
FIG. 4 shows a circuit diagram illustrating another exemplary detailed implementation for a portion of FIG. 2 in accordance with an embodiment of the present invention.

FIG. 4 shows a circuit 400 illustrating another exemplary detailed implementation for one of buffers 204 of FIG. 2 in accordance with an embodiment of the present invention. Circuit 400 includes full bi-directional tri-state buffers to drive corresponding data lines 210 (labeled buffered DATA, buffered DATAN, and DATA, DATAN) as shown. Buffer enable signal 212 controls the operation (e.g., for read or write) of the tri-state buffers.

Techniques discussed herein may provide advantages over conventional memory implementations. For example, configuration memory 200 (FIG. 2) employing bi-directional buffers (i.e., buffers 204) may use less area, require less critical timing, and require fewer control signals than conventional techniques (e.g., multiple read sense amplifiers). The memory cells within each memory section 202 may be sized for stability based on the associated memory section 202. Consequently, additional buffers 204 and memory sections 202 may be added to the column (e.g., for a larger programmable logic device within the family of devices) with no adverse affects to the memory cell. Furthermore, additional complex circuitry associated with conventional techniques (e.g., additional multiplexers and control circuitry to multiplex data from separated sense amplifier sections) is not required to extend the column of configuration memory 200.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device comprising:
   a column of configuration memory divided into a plurality of sections;
   a pair of data lines disposed within the column of configuration memory; and
   a buffer disposed between each of the sections and adapted to couple the data lines between the sections adjacent to the buffer.

2. The programmable logic device of claim 1, further comprising an input/output circuit coupled to the column of configuration memory and adapted to read data from the column of configuration memory via the data lines.

3. The programmable logic device of claim 2, wherein the input/output circuit is further adapted to write data to the column of configuration memory via the data lines.

4. The programmable logic device of claim 2, wherein the input/output circuit comprises sense amplifiers and data buffers.

5. The programmable logic device of claim 1, wherein the buffer is bi-directional.

6. The programmable logic device of claim 1, wherein the buffer comprises:
- a tri-state buffer coupled to each of the data lines;
- a keeper circuit coupled to the data lines and adapted to maintain a voltage level on the data lines; and
- a pull-down circuit coupled to the data lines.

7. The programmable logic device of claim 1, wherein the buffer comprises two pairs of buffers coupled respectively to the data lines and adapted to provide bi-directional buffering for data on the data lines.

8. The programmable logic device of claim 1, wherein the sections comprise a plurality of memory cells.

9. The programmable logic device of claim 8, wherein the memory cells are six-transistor static random access memory cells.

10. The programmable logic device of claim 1, wherein the buffer is adapted to buffer data on the data lines.

11. A configuration memory within an integrated circuit comprising:
- a plurality of partial columns of memory;
- a pair of data lines routed through the partial columns of memory; and
- means for coupling the data lines and buffering the data on the data lines between the partial columns of memory.

12. The configuration memory of claim 11, further comprising means for reading and writing to the partial columns of memory via the data lines.

13. The configuration memory of claim 11, further comprising means for enabling the coupling means and the buffering means to drive data via the data lines from the reading and writing means during a write operation and towards the reading and writing means during a read operation.

14. The configuration memory of claim 11, further comprising means for addressing the partial columns of memory.

15. The configuration memory of claim 11, wherein each of the partial columns of memory comprises a plurality of memory cells arranged in a plurality of rows.

16. A method of providing configuration memory within a programmable logic device, the method comprising:
- providing a plurality of columns of memory, with each of the columns divided into segments;
- providing a corresponding pair of data lines through each of the columns of memory; and
- coupling the data lines between the segments to provide data buffering for data on the data lines.

17. The method of claim 16, wherein the data buffering is bi-directional.

18. The method of claim 16, wherein the data buffering drives the data away from data input/output buffets during a write operation.

19. The method of claim 16, wherein the data buffering drives the data towards data input/output buffers during a read operation.

20. The method of claim 16, wherein each of the segments comprises a plurality of static random access memory arranged in rows.

21. A memory device comprising:
- a column of configuration memory divided into a plurality of sections;
- a pair of data lines disposed within the column of configuration memory; and
- a buffer disposed between each of the sections and adapted to couple the data lines between the sections adjacent to the buffer.

\* \* \* \* \*